(12) United States Patent
Imai

(10) Patent No.: US 6,456,364 B1
(45) Date of Patent: Sep. 24, 2002

(54) SEMICONDUCTOR MANUFACTURING APPARATUS, AND DEVICE MANUFACTURING METHOD

(75) Inventor: Shunzo Imai, Yamato (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/447,238

(22) Filed: Nov. 23, 1999

(30) Foreign Application Priority Data

Nov. 24, 1998 (JP) .............................. 10-347979

(51) Int. Cl.⁷ .................. G03B 27/58; G03B 27/64; B65G 17/08
(52) U.S. Cl. .................. 355/72; 355/76; 414/217
(58) Field of Search .................. 355/53, 72, 76, 355/75, 40; 414/416, 217, 749; 118/52; 430/311

(56) References Cited

U.S. PATENT DOCUMENTS

| 3,996,591 A | * | 12/1976 | Hayward | 343/225 |
| 4,514,958 A | * | 5/1985 | Hoorn | 53/266 |
| 4,682,801 A | * | 7/1987 | Cook et al. | 292/251.5 |
| 5,218,408 A | * | 6/1993 | Inada et al. | 355/231 |
| 5,272,585 A | * | 12/1993 | Cravero | 307/116 |
| 5,660,517 A | * | 8/1997 | Thompson et al. | 414/217 |
| 6,032,858 A | * | 3/2000 | Yazumi et al. | 235/379 |
| 6,085,063 A | * | 7/2000 | Morita et al. | 399/381 |
| 6,122,556 A | * | 9/2000 | Tochiori et al. | 700/17 |
| 6,123,022 A | * | 9/2000 | Takata | 101/119 |

* cited by examiner

Primary Examiner—Russell Adams
Assistant Examiner—Henry Hung Nguyen
(74) Attorney, Agent, or Firm—Fitzpatrick, Cella, Harper & Scinto

(57) ABSTRACT

A semiconductor manufacturing apparatus having a guard system, an interlocking system operable in response to loss of function in a portion of the guard system, to stop a corresponding operation in the apparatus, and an interlock disabling switch for disabling the interlocking through the interlocking system. The structure accomplishes prompt disabling of the interlocking, to improve the efficiency of a maintenance or service operation. A safeguard can be achieved without a decrease of throughput.

25 Claims, 14 Drawing Sheets

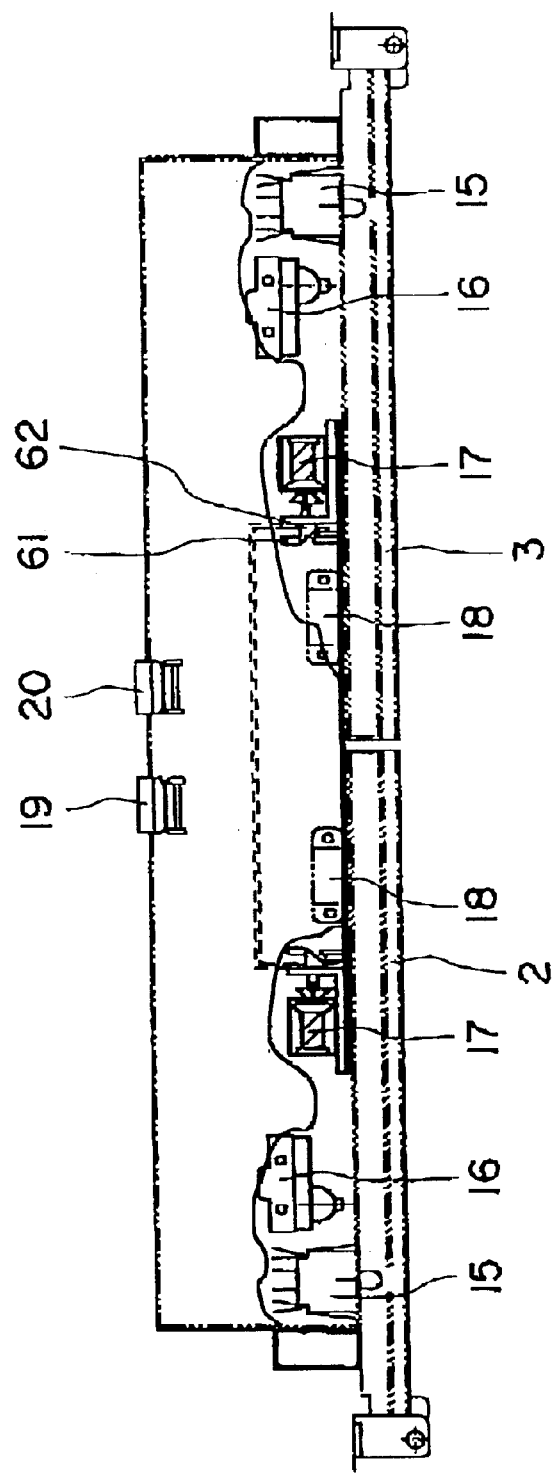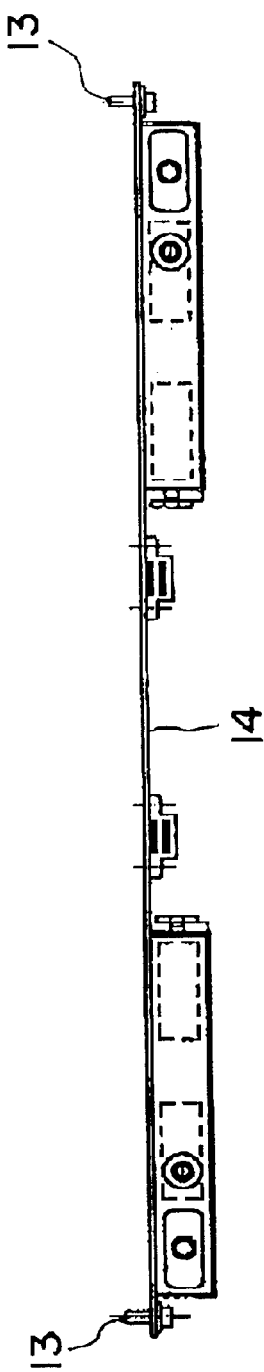
FIG. 11A
FIG. 11B

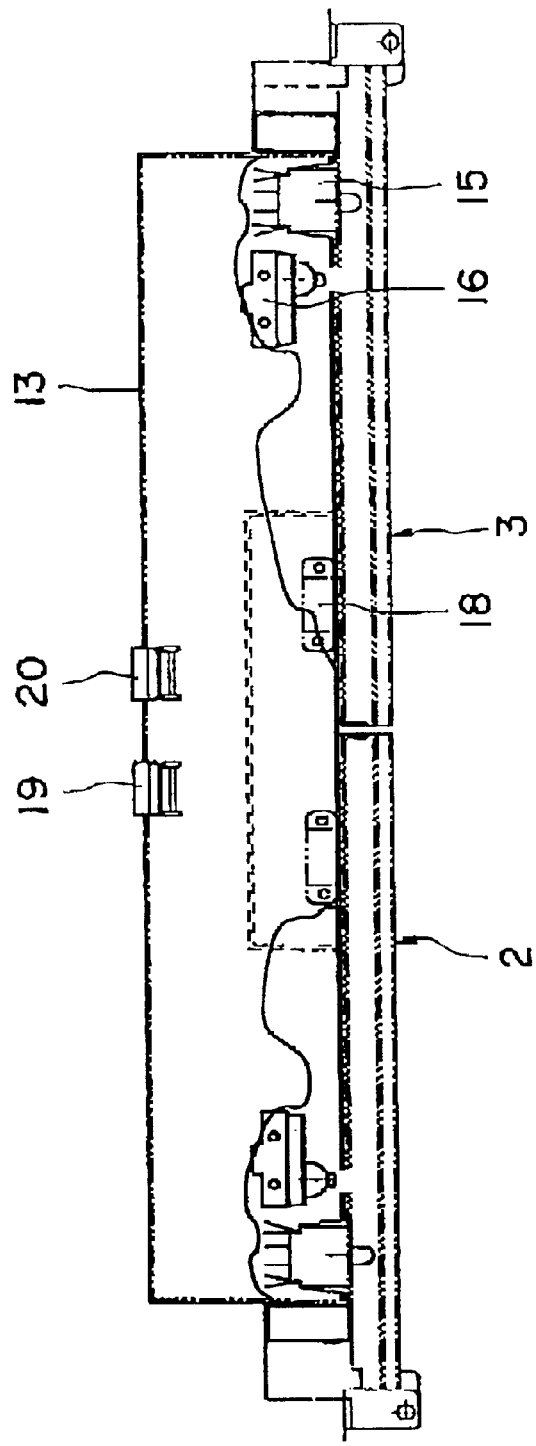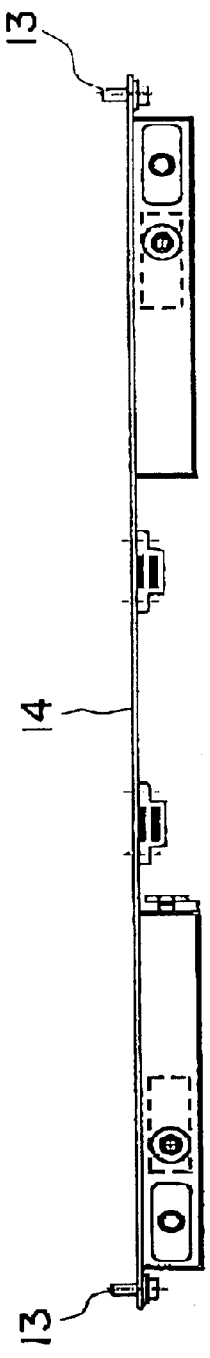

SEMICONDUCTOR MANUFACTURING APPARATUS, AND DEVICE MANUFACTURING METHOD

FIELD OF THE INVENTION AND RELATED ART

This invention relates to a semiconductor manufacturing apparatus with a function of door locking or interlocking, for safety, and a device manufacturing method using the same.

In a semiconductor exposure apparatus, safety should be considered in those portions such as an X-Y stage, a wafer conveyance system, and a reticle conveyance system (movable systems) as well as a laser system (optical system), for example. Conventionally, except the X-Y stage, those portions are provided with a structure (interlock structure) that the movement is stopped as a door of a chamber is opened. The X-Y stage is not provided with such function, because, if the X-Y stage is interlocked, it takes a very long time to perform precision inspection which is very undesirable in respect to the throughput.

A maintenance operation is performed while disabling the interlocking function, that is, by turning an interlock disabling switch on and by operating cheat switches for various doors Since the maintenance has to be done after disabling various interlocking devices, it needs complicated operations. Also, the provision of an interlocking function itself is not always good, particularly in respect to the throughput. If a door is opened, the operation of the apparatus is interrupted. Depending on the procedure being performed, some steps have to be done once more.

On the other hand, there are operations to be done by an operator, such as a work of opening a window of a chamber and unloading a wafer cassette, and a work of opening another window of the chamber and replacing a reticle by another. Also, where excimer laser light is used as exposure light, the emission of the excimer laser light has to be interrupted as the chamber window is opened for replacement of the wafer cassette. The interlocking function operates when a chamber window is opened during the operation of the wafer conveying system or of the excimer laser system. This leads to a decrease of the throughput, as described above.

SUMMARY OF THE INVENTION

It is an object of the present invention to provide a semiconductor manufacturing apparatus and/or a device manufacturing method, by which the interlock disabling operation can be done promptly such that the maintenance operations or service operations can be done with a higher efficiency, by which the safety can be assured without decreasing the throughput, or by which the maintenance operation or the like can be done while keeping a chamber door or the like opened.

In accordance with an aspect of the present invention, there is provided a semiconductor manufacturing apparatus, comprising: guard means; interlocking means operable in response to loss of function in a portion of said guard means, to stop a corresponding operation in said apparatus; an interlock disabling switch for disabling the interlocking through said interlocking means; and a double disabling switch for disabling the interlock disabling function of said interlocking disabling switch.

The double disabling switch may be operable automatically in response to recovery of the lost function of said portion of said guard means, and wherein, in response thereto, said interlock disabling switch looses its switching function.

The guard means may include one of a door and a cover, and said double disabling switch may be provided adjacent to said door or said cover.

The function in said portion of said guard means may be lost as said door or said cover is opened, and said double disabling switch may be arranged so that said interlock disabling switch acquires a switching function in response to the opening or demounting of the door or the cover and that it looses the switching function in response to the closing or mounting of the door or the cover The door or the cover may be closed or mounted, for temperature control of said apparatus.

The apparatus may further comprise display means for indicating that said interlock disabling switch is turned on as the same is turned on.

The apparatus may further comprise prevention means for preventing resuming the operation of said apparatus as said interlock disabling switch is turned on.

In accordance with another aspect of the present invention, there is provided a semiconductor manufacturing apparatus, comprising: guard means; a plurality of interlocking means each being operable in response to loss of function in a portion of said guard means, to stop a corresponding operation in said apparatus; and an interlock disabling switch for disabling the interlocking through at least two of said interlocking means.

In accordance with a further aspect of the present invention, there is provided a semiconductor manufacturing apparatus, comprising: an opening and closing mechanism including a door or a cover being made openable and closable or mountable and demountable; and locking means for locking said opening and closing mechanism so that said mechanism is released only at a predetermined timing whereat the opening through said opening and closing mechanism is allowed.

In accordance with a yet further aspect of the present invention, there is provided a semiconductor manufacturing apparatus, comprising: an opening and closing mechanism including a door or a cover being made openable and closable or mountable and demountable; discriminating means for discriminating whether said opening and closing mechanism may be opened or not; and output means for producing an output corresponding to a result of the discrimination.

In accordance with a still further aspect of the present invention, there is provided a semiconductor device manufacturing method, comprising the steps of: applying a photosensitive material onto a wafer; performing a process by use of a semiconductor manufacturing apparatus as described above; and developing the wafer after being exposed.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 11A and 11B are schematic views, respectively, for explaining the structure of an electromagnetic lock, a micro-switch and a cheat switch, in the apparatus of FIG. 10.

FIGS. 17A and 17B are schematic views, respectively, for explaining the structure of a lamp, a micro-switch, and a cheat switch, in the apparatus of FIG. 16.

DESCRIPTION OF THE PREFERRED EMBODIMENTS

Figure 1:
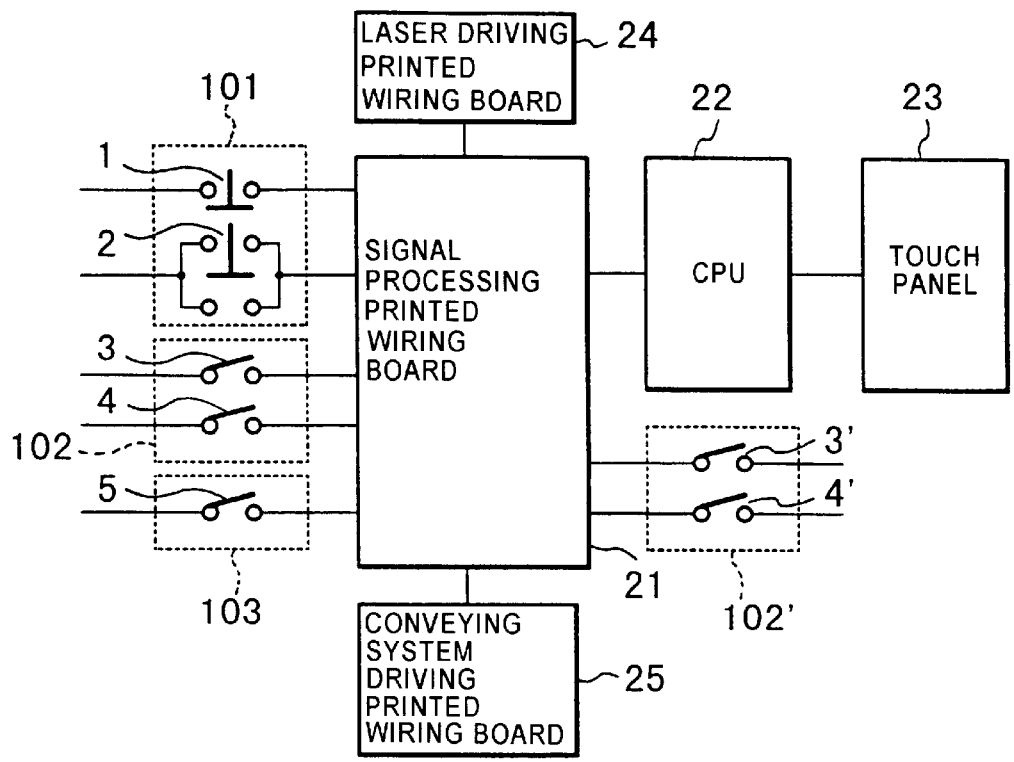
FIG. 1 is a block diagram of a system according to a first embodiment of the present invention, which includes an interlocking switch, an interlock disabling switch, a restarting switch, and an unconditional interlock disabling switch.

Preferred embodiments of the present invention will now be described with reference to the accompanying drawings.

In a first preferred embodiment of the present invention, if an operator disables interlocking and then the operator fails to reset the same, it is notified to the operator or, alternatively, the interlocking is enabled automatically in response to any work action to be taken.

More specifically, there is a double disabling switch which is operable to disable the interlock disabling function of the unconditional interlock disabling switch. When any function of guard means having been lost is resumed, the double disabling switch operates automatically in response thereto, such that the switching function of the unconditional interlock disabling switch is lost or disabled. With this structure, even if the operator is not aware of the interlock disabling or the operator does not remember the same, the double disabling switch operates in response to recovery of the lost function of the guard means, as by closure of the door, for example, whereby the disabled state of the interlocking is released. Namely, the structure can prevent failure of interlocking when the function in a portion of the guard means is lost again.

More specifically, the guard means may include a door and/or a cover. The double disabling switch may be provided adjacent the door or the cover which is operationally associated with interlocking means. The loss of function in a portion of the guard means may occur as the door is opened or the cover is demounted. In response to the opening or demounting of the door or the cover, the double disabling switch may impart a switching function to the unconditional interlock disabling switch. In response to the closure or the re-mounting of the door or the cover, the switching function of the unconditional interlock disabling switch may be lost. The door or the cover may be required to be closed or mounted; for the temperature control of the apparatus.

There may be display means for displaying that the unconditional interlock disabling switch is turned on, as the same is turned on. Further, the system may be arranged so that, when the unconditional interlock disabling switch is turned on, restart of operation of the apparatus is physically prohibited. Namely, the structure may be that, when the unconditional interlock disabling switch is turned on, the switch at that position may interfere with the door or cover so that the latter can not be closed. In that occasion, an operator or a service person will easily become aware of that the door can not be closed, and he/she will turn back the unconditional interlock disabling switch off. The apparatus will then be returned to its original state.

In a second preferred embodiment of the present invention, there may be a wafer cassette unloading window, a reticle unloading window and an X-Y stage maintenance window each of which may be provided with an electromagnetic lock. The electromagnetic lock may be released to allow opening the window, only at a timing in the sequence whereat the opening of the window is allowed. In the second preferred embodiment and also in a third preferred embodiment, there may be a wafer cassette conveying system operationally associated with the wafer cassette unloading window, a reticle conveying system operationally associated with the reticle unloading window, and a laser device operationally associated with the X-Y stage maintenance window. When any of these windows is opened, the operation of a corresponding mechanism may be interrupted through interlocking. There may be two interlocking switches, one of which may function as a cheat switch while the other may function as a micro-switch that can be disabled by means of a disabling switch with a keylock.

[First Embodiment]

Figure 7:
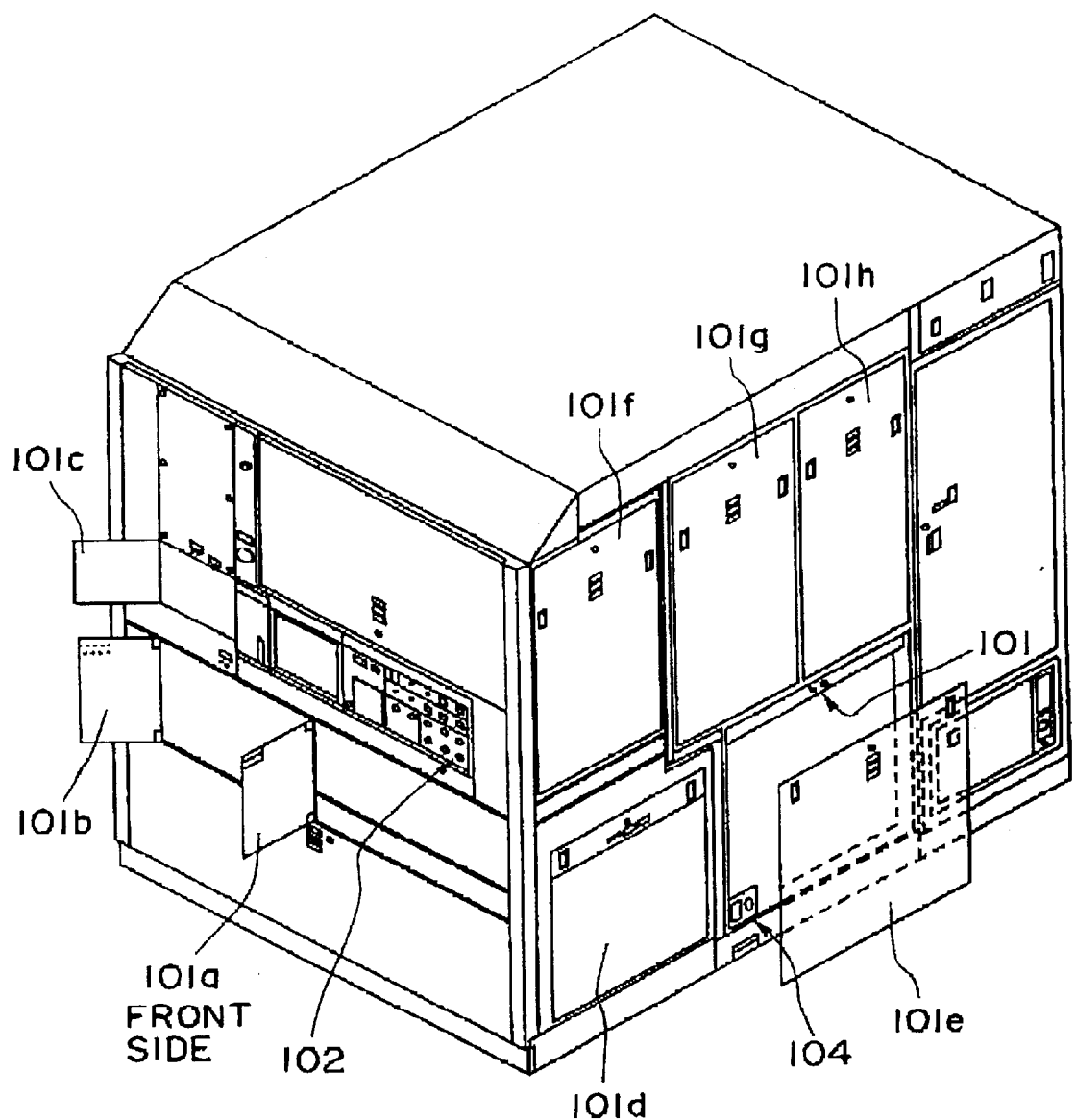
FIG. 7 is a perspective view of an outside appearance (chamber) of a semiconductor exposure apparatus to which the present invention is applied.

FIG. 7 is a perspective view of an outside appearance of a semiconductor exposure apparatus to which the present invention is applicable FIG. 1 is a block diagram of an interlocking system according to the present invention, being incorporated into the exposure apparatus.

The interlocking system includes an interlock switch mounted on a major-assembly side of a cover, which covers a portion of the exposure apparatus. More specifically, denoted in FIG. 1 at 1 is an interlock switch (micro-switch), and denoted at 2 is another interlock switch (cheat switch) The pair 101 of these switches 1 and 2 are mounted on a structure on which doors or covers 101a–101h are mounted. In FIG. 7, only the pair 101 of switches disposed opposed to the cover 101e are illustrated. The number of switch pairs 101 is variable, in dependence upon the structure of a semiconductor manufacturing apparatus or upon the structure of the portion to be covered by the door or the cover. Also, use of either a cheat switch or a micro-switch may be determined in accordance with the frequency or quality of the maintenance or service as required. Here, description will be made on an example wherein the switches 1 and 2 are mounted on a semiconductor manufacturing apparatus having a laser light and a wafer conveying system which are to be interlocked.

As shown in FIG. 1, the switches 1 and 2 have their contacts disengaged. This corresponds to a state in which the cover is demounted Denoted at 3 is an interlock disabling switch for disabling the interlocking. Denoted at 4 is a switch for restarting the operation of the portion, having been interrupted through the interlocking, after the interlock is disabled. The pair 102 of the switches 3 and 4 are illustrated, in FIG. 7, at the front side of the apparatus. Since there are two portions each being to be interlocked, as described above, there is another pair 102' of switches 3' and 4' corresponding to the pair 102 of the switches 3 and 4. Denoted at 5 in FIG. 1 is an unconditional interlock disabling switch for setting at once the two interlocks disabled. Denoted at 21 is a signal processing board, and denoted at 22 is a central processing unit (CPU). Denoted at 23 is a touch panel and monitor, and denoted at 24 is a laser driving board. Denoted at 25 is a conveying system driving board or substrate.

Now, in the structure described above, a case where the cover 101e (FIG. 7) is demounted will be explained. The following description applies also to the covers 101a–101h. First, when the cover 101e is demounted, the micro-switch 1 and the cheat switch 2 in the pair 101 are opened. A corresponding signal is processed by the signal processing board 21, and a corresponding output is applied to the laser driving board 24 and the conveyance system driving board 25. Thus, the laser emission of a laser device (not shown) and the drive of the conveyance system are stopped or interrupted. In that occasion, without the CPU 22, the signal is directly transmitted to the laser driving board 24 and the conveyance system driving board 25, to interrupt the laser emission and the drive of the conveyance system. The information of interlocking is transmitted to the touch panel 23 through the CPU 22, whereby the location where the interlocking is actuated is displayed.

Subsequently, if restart of the operation is desired, the cover 101e is mounted again. In response thereto, the contacts of the switches 1 and 2 are closed. Then, the restart button may be pushed down. If the interlocking is to be disabled, the interlock disabling switch 3 is turned on, and the cover 101c is demounted. Also, an operation rod of the cheat switch 2 is pulled to turn the same on, and then the restart button 4 is turned on. With this operation, the corresponding portion operates again.

What described above is a normal operation. A case to be particularly considered is that there are plural locations where the interlocking is to be provided. In that occasion, for every location, the cheat switch has to be disabled. There may be ten or more locations such as above, in a semiconductor manufacturing apparatus, and complicated operations may be necessary. In order to avoid such inconvenience, there is an unconditional interlock disabling switch 5 provided.

As the switch 5 is turned on, all the functions of the switches 1–3 are disabled. The corresponding processings are performed by the signal processing board 21. This structure allows doing the work without anxiety to the interlocking. The switches 3 and 5 may be controlled by a service person, and they may comprise key-shaped selector switches of different shapes. Use of such key-shaped switch is to clarify that any operation to be performed while actuating the interlock disabling therefor switch is the work to be done by a service person. Usually, there is a hierarchy established in regard to the power authority for controlling the machine in a plant. A service person is generally regarded higher, while an operator is regarded lower. Therefore, an operator does not normally get access to that switch.

[Second Embodiment]

Figure 2:
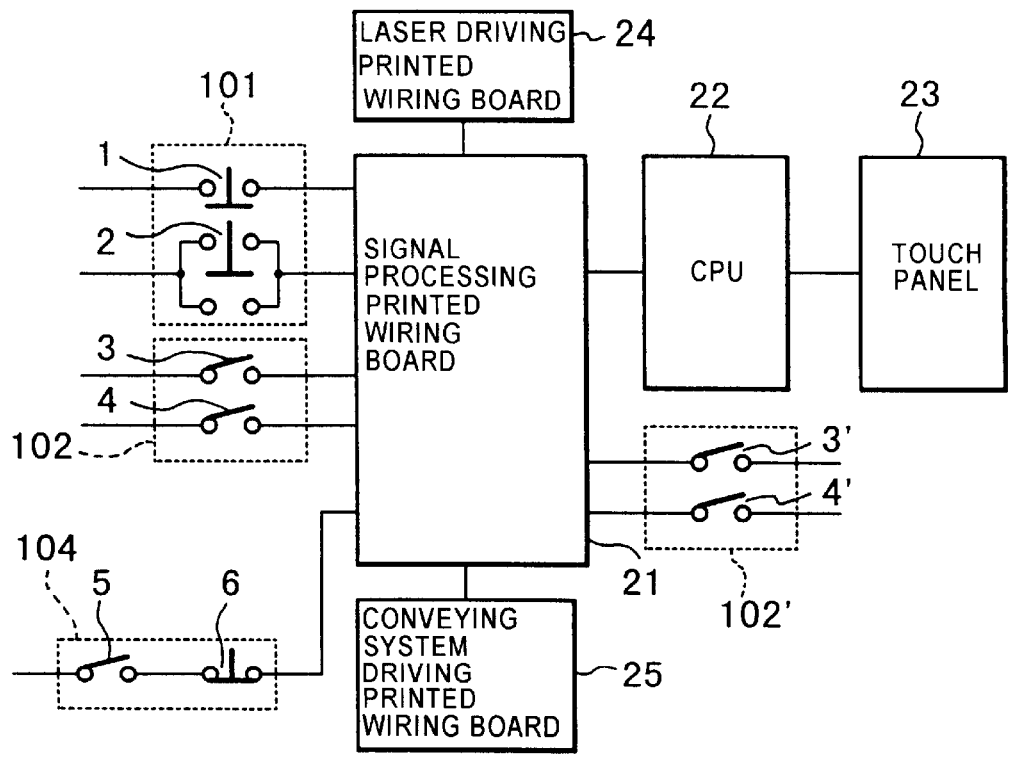
FIG. 2 is a block diagram of a system according to a second embodiment of the present invention, which includes an interlocking switch, an interlock disabling switch, a restarting switch, an unconditional interlock disabling switch, and an interlock double disabling switch.

FIG. 2 shows a second embodiment. This embodiment provides a solution for a problem which may occur in the first embodiment: that is, it is not sure that the service person turns the unconditional interlock disabling switch 5 off. As a solution for this, an interlock double disabling switch 6 is provided in relation to such door that, unless it is closed, the operation can not be continued. With this structure, even if the unconditional interlock disabling switch 5 is carelessly left turned on, the interlocking is prevented from being disabled.

Figure 3:
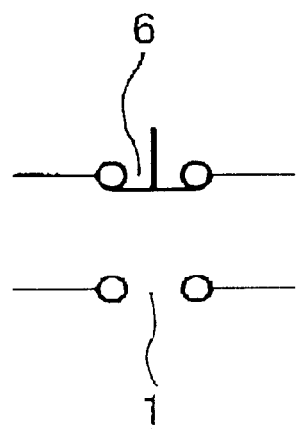
FIG. 3 is a schematic view for explaining a inversive relation between a switch 1 and an interlock double disabling switch 6.
Figure 4:
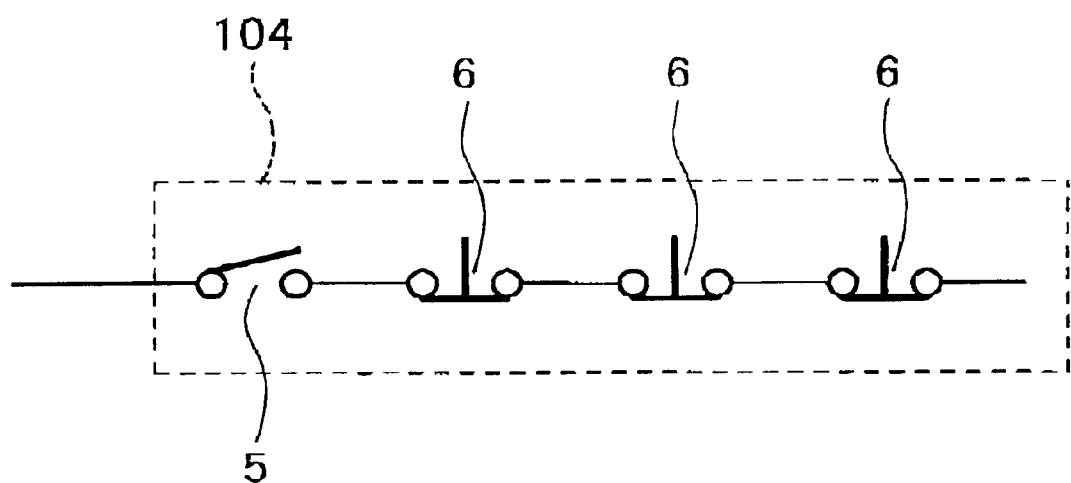
FIG. 4 is a schematic view of another example of an interlock double disabling switch.

The interlock double disabling switch 6 is provided in series with the unconditional interlock disabling switch 5. The pair 104 of these switches are disposed opposed to the cover 101e, as shown in FIG. 7. Namely, as shown in FIG. 3, the interlock double disabling switch 6 is in an inversive relation with the switch 1, and thus it can be accomplished by using opposite contacts of a single switch. Also, for better safety, as shown in FIG. 4, there may be plural interlock double disabling switches 6 which may be mounted on different covers, respectively, and which may be connected in series to the unconditional interlock disabling switch 5.

Generally, in semiconductor manufacturing apparatuses, temperature control is important. Thus, usually, it is performed while keeping the door of a chamber closed. In consideration of this, when an operator closes a cover (101e) where an interlock disabling switch 6 is mounted, the interlock disabling switch 6 is opened such that, independently of the state of the interlock disabling switch 5, the unconditional interlock disabling switch 5 is turned off.

Here, if the cover where the unconditional interlock disabling switch 5 is provided is used also as a cover where an interlock switch is mounted, the result is more sure. Namely, unless covered, the interlock operates and an associated portion does not operate. On the other hand, even if a cover is mounted while the interlocking is kept disabled, the interlock double disabling switch 6 functions to disable the unconditional interlock disabling switch 5.

[Third and Fourth Embodiments]

Figure 5:
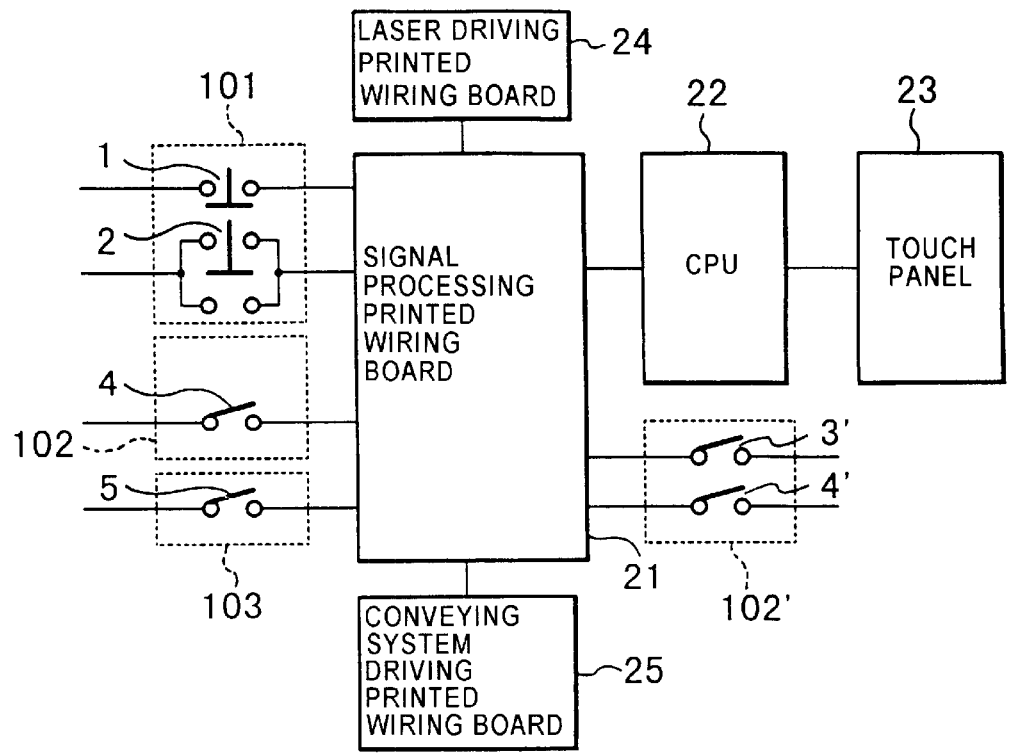
FIG. 5 is a block diagram of a system according to a third embodiment of the present invention, which includes an interlocking switch, a restarting switch, and an unconditional interlock disabling switch.
Figure 6:
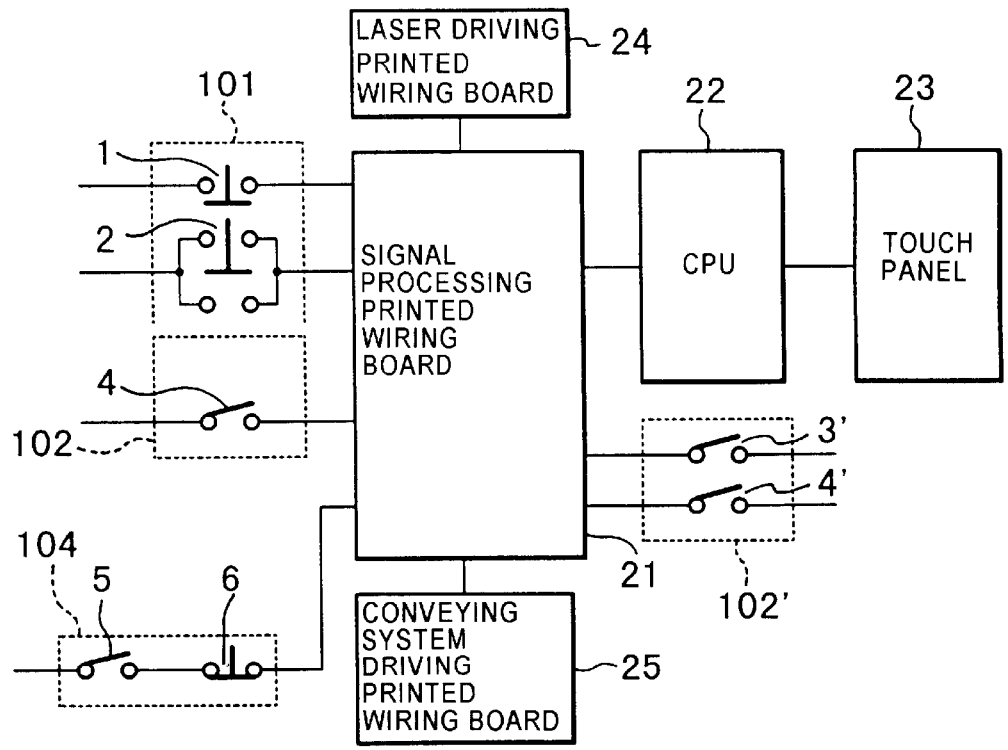
FIG. 6 is a block diagram of a system according to a fourth embodiment of the present invention, which includes an interlocking switch, a restarting switch, an unconditional interlock disabling switch, and an interlock double disabling switch.

FIGS. 5 and 6 shows third and fourth embodiments. These embodiments do not have an interlock disabling switch such as at 3 in FIGS. 1 and 2. In these embodiments, the function of the interlock disabling switch 3 is substituted by the unconditional interlock disabling switch 5.

[Fifth Embodiment]

Figure 8:
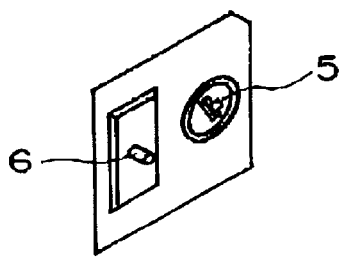
FIG. 8 is an enlarged view of an unconditional interlock disabling switch and an interlock double disabling switch, in the apparatus of FIG. 7.
Figure 9:
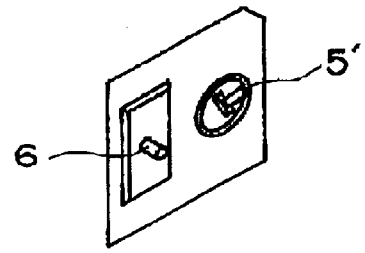
FIG. 9 shows a fifth embodiment of the present invention, wherein the shape of the unconditional interlock disabling switch of FIG. 8 is partially enlarged to prevent, when the same is activated, a door from being returned to its initial state.

FIG. 9 shows an unconditional interlock disabling switch according to a fifth embodiment. In this embodiment, the shape of a portion of the unconditional interlock disabling switch 5 shown in FIG. 8 is enlarged, to provide an unconditional interlock disabling switch 5'. When the switch 5' is turned on, the door 101e can not be returned to its original state. Thus, it becomes sure that the service person puts back the apparatus to the operator after the normal state of the apparatus is recovered.

[Sixth Embodiment]

Figure 10:
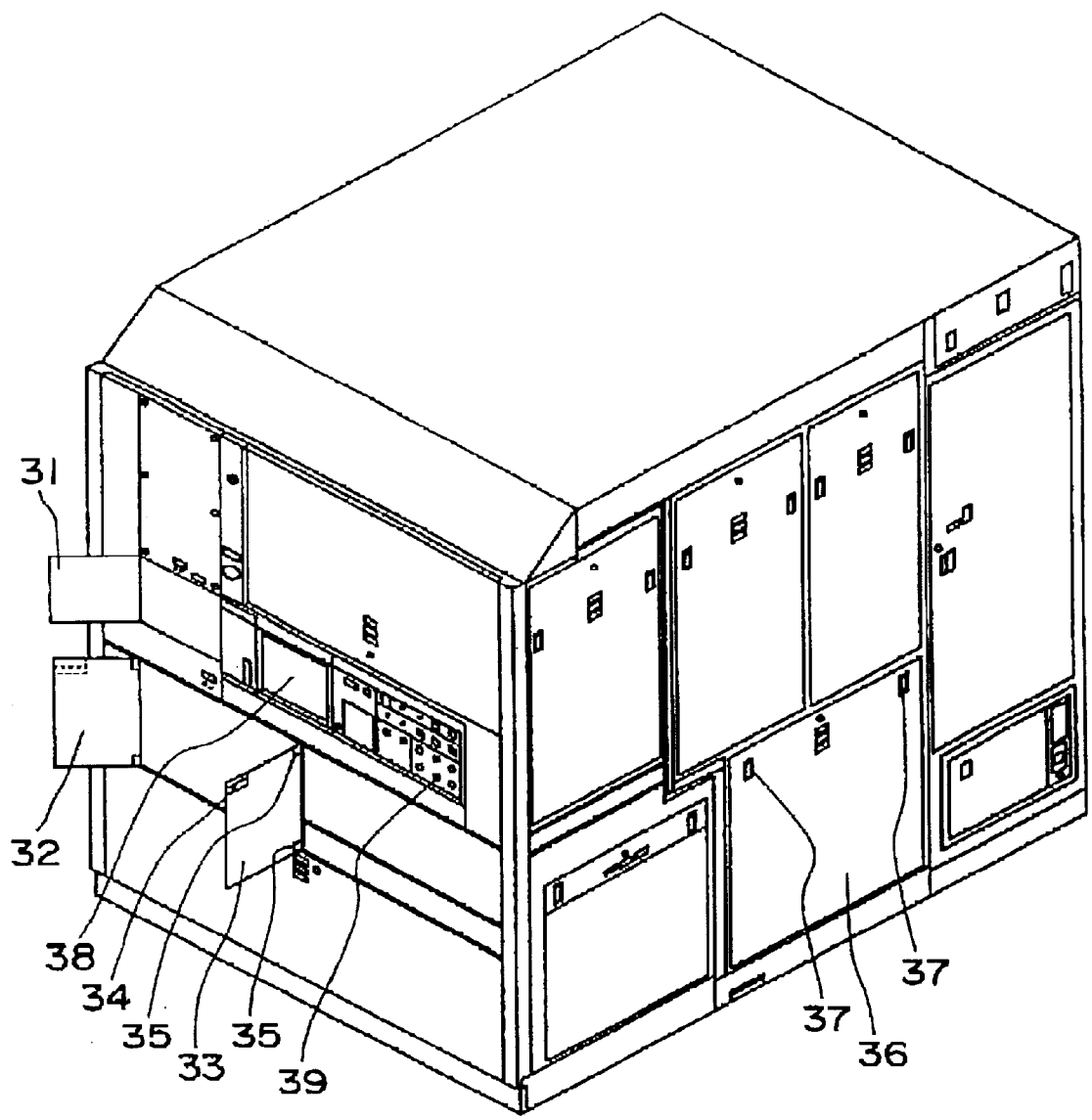
FIG. 10 is a perspective view of an outside appearance of a semiconductor exposure apparatus according to a sixth embodiment of the present invention.
Figure 12:
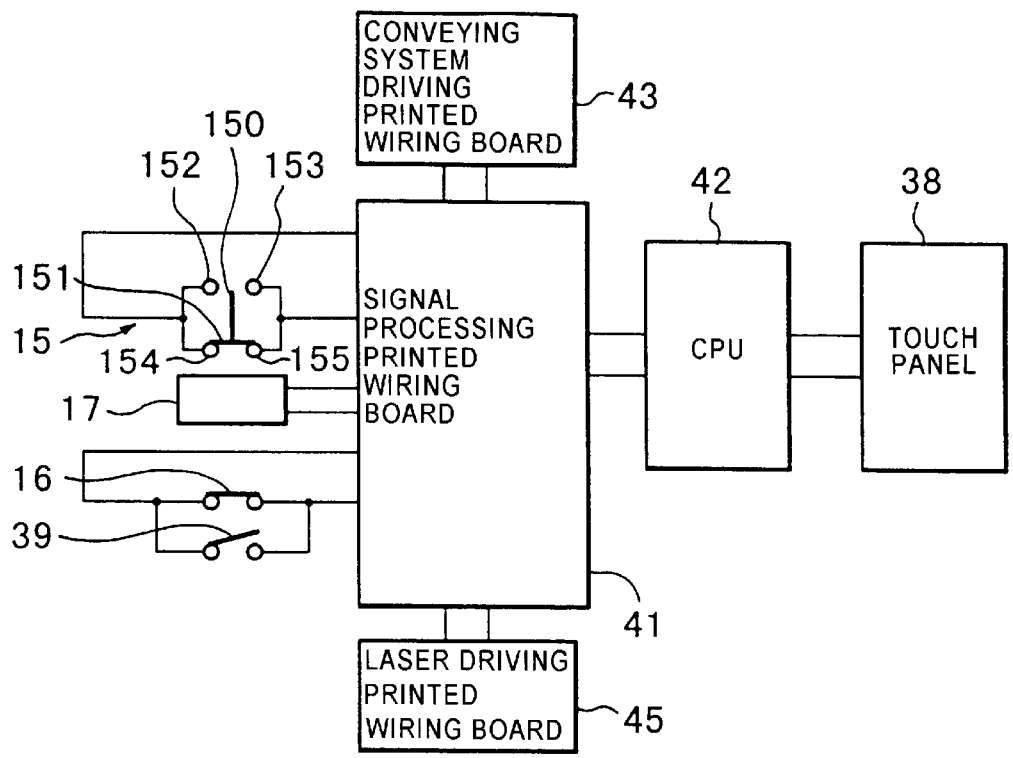
FIG. 12 is a circuit block diagram for explaining switches in a state in which the door of the apparatus of FIG. 10 is closed.
Figure 13:
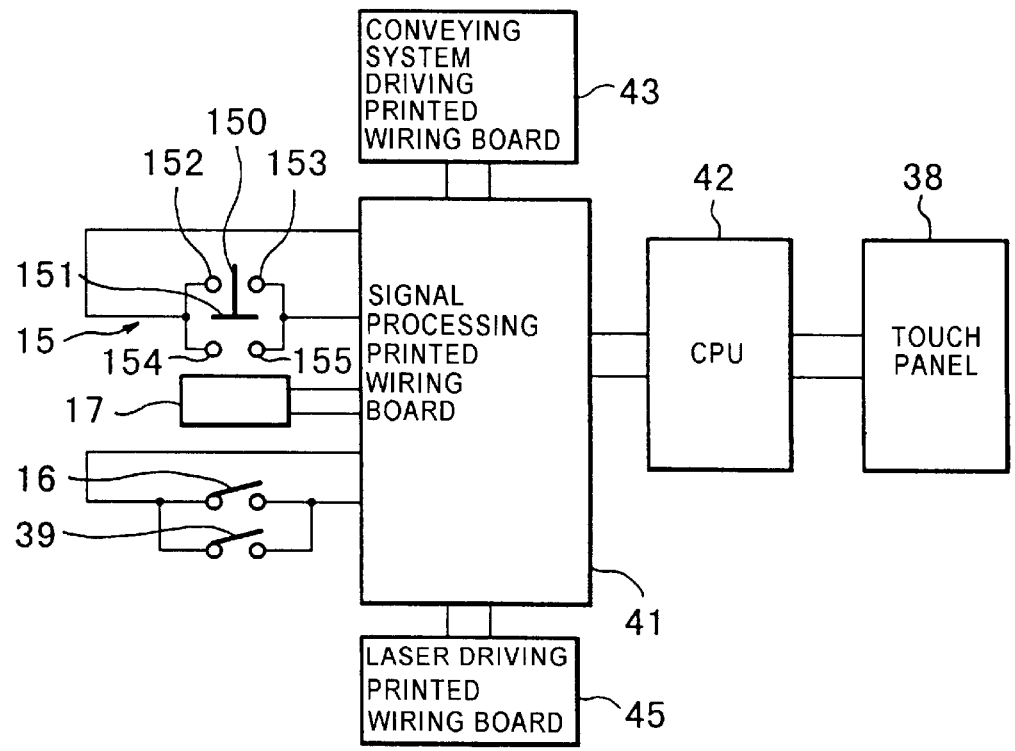
FIG. 13 is a circuit block diagram for explaining switches in a state in which the door of the apparatus of FIG. 10 is opened.
Figure 14:
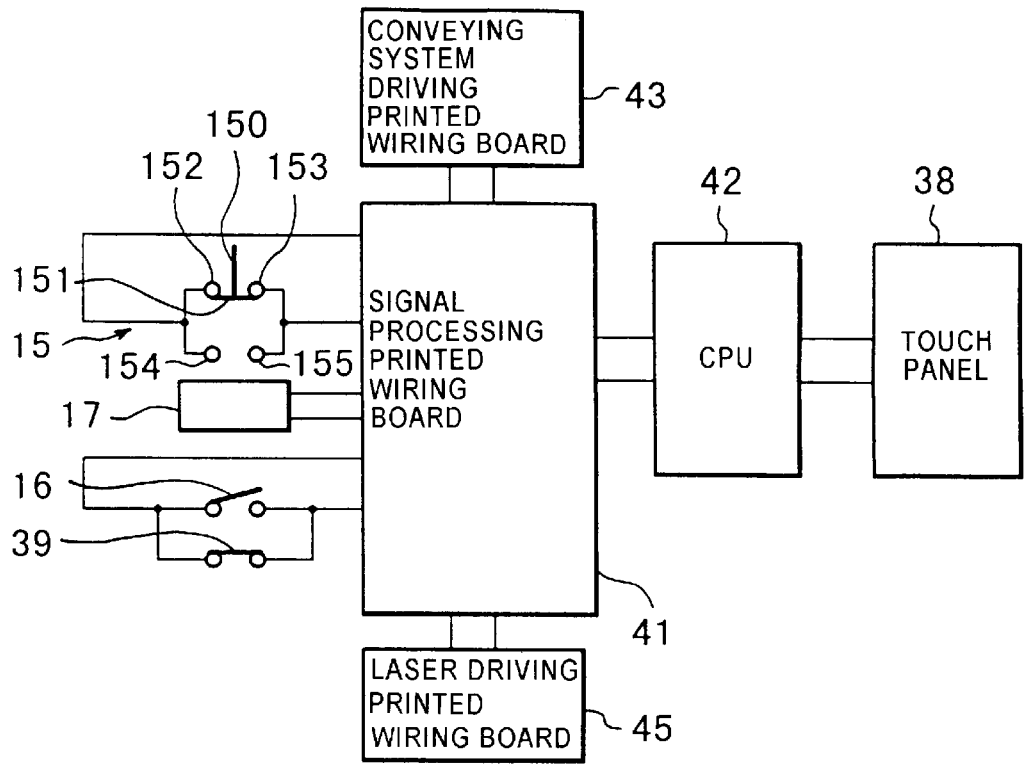
FIG. 14 is a circuit block diagram for explaining switches in a state in which the door of the apparatus of FIG. 10 is opened while the interlocking is disabled.

FIG. 10 is a perspective view of an outside appearance of a semiconductor exposure apparatus according to a sixth embodiment of the present invention. FIGS. 11A and 11B illustrate a portion around one door of the exposure apparatus. FIG. 12 is a block diagram, showing an interlocking switch and an electromagnetic switch, for example, associated with this door. Particularly, FIG. 12 shows a state in which the door is closed, and FIG. 13 shows a state in which the door is opened. FIG. 14 shows a state in which the door is opened, while the interlocking is kept disabled.

As shown in FIG. 10, the exposure apparatus has doors 31–33 and a cover 36, which are made openable and closable or demountable. The door 31 is a door for loading and unloading of reticle cassettes, and it is illustrated as being opened. Details of the inside structure are not illustrated. The doors 32 and 33 function as doors for loading and unloading of wafer cassettes These two doors open like a casement window. Details of the inside structure are not illustrated. The doors 32 and 33 are symmetric. While the following description will be made on the door 33, the same will apply to the door 32. Denoted at 34 is a handle to be grasped to open the door 33. Denoted at 35 are hinge mechanisms mounted at the top and bottom of the door 33. The cover 36 is a cover for maintenance of an X-Y stage. The cover is illustrated as being closed. Denoted at 37 is a handle and locking member. When the upper portion of the member 33 is pushed to open the cover 36, its lower portion is protruded in response thereto. The whole cover 36 can be demounted while holding the protruded portion. Denoted at 38 is a touch panel through which an operator can input a command or prepare a job. Denoted at 39 is an interlock disabling switch having a key lock. The key lock is provided because the interlock disabling switch functions to release the safegard such that it should be controlled by a superior operation manager.

Denoted at 41 in FIG. 12 is a signal processing board which operate to transfer signals from the switches to a CPU 42. Also, it operates to directly interrupt a drive force for the conveyance system through a conveyance system driving board 43.

FIGS. 11A and 11B best show a feature of this embodiment. FIG. 11A shows a unit portion at a wafer cassette window 33, as seen from the above. FIG. 11B show this unit portion, in a front view. This unit portion is held fixed to a chamber frame (not shown) by means of fixing screws 13. Denoted at 15 is a cheat switch for disabling the interlocking. Denoted at 16 is a micro-switch, and denoted at 17 is an electromagnetic lock. Denoted at 18 is a magnet latch for holding the doors 32 and 33 closed. Denoted at 19 and 20 are grommets for passing therethrough wiring members, not shown. Denoted at 61 is an L-shaped metal plate member having a bore, formed therein, to be engaged with a pawl member 62 of the electromagnet lock 17. It is connected to the door by Screws. As the electromagnet lock 17 is turned off, the pawl member 62 is protruded to be engaged with the meal plate member 61. As the electromagnet lock 17 is turned on, the pawl member 62 is retracted and disengaged from the metal plate member 61.

Figure 15:
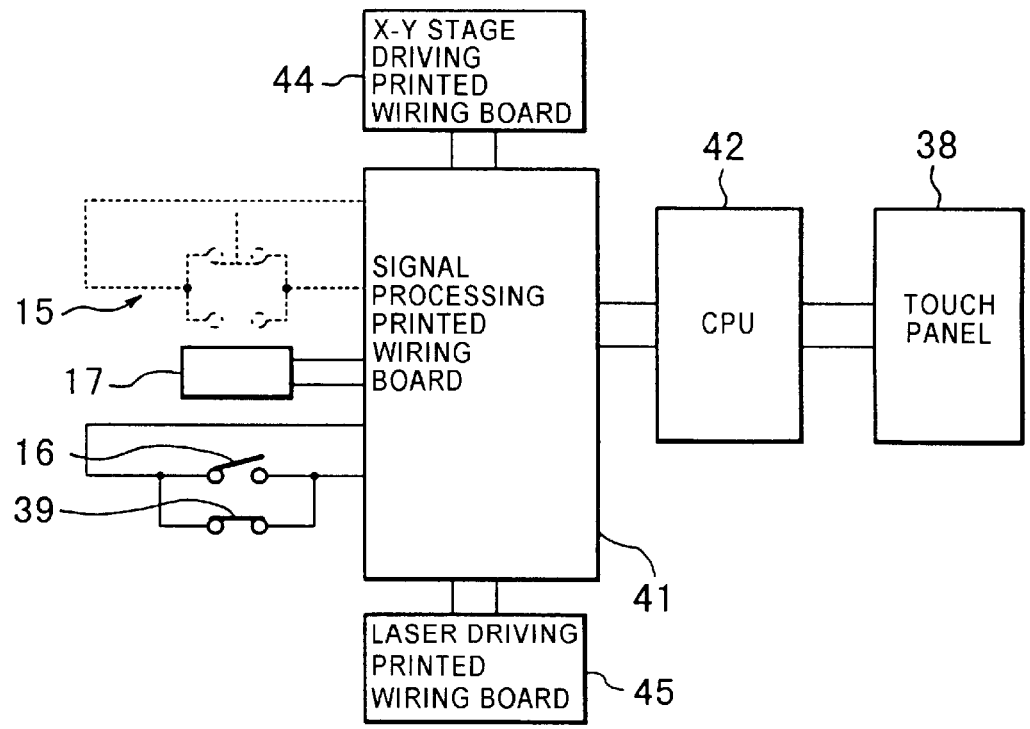
FIG. 15 is a circuit block diagram for explaining switches associated with another door in the apparatus of FIG. 10

FIG. 12 illustrates the contacts of the cheat switch 15, of the micro-switch 16 and of the interlock disabling switch 39, in a state wherein the door is closed. FIG. 13 illustrates the contacts of the switches in a state in which the door is opened. FIG. 14 illustrates the contacts of the Switches when the interlocking is disabled after the door is opened. FIG. 15 is a block diagram of the X-Y stage door 36 portion, and a CPU 42 and a signal processing board 41 differ from those Shown in FIGS. 12–14. Denoted at 44 is an X-Y stage driving board or substrate, and denoted at 45 is a laser driving board. As the door is opened, the X-Y stage is not interlocked whereas the laser is interlocked.

Denoted at 150 in FIG. 12 is an operation rod for interchanging the contacts of the cheat switch 15. Denoted at 151 is a metal piece mounted at a free end of the rod 150, and it functions to connect contacts 152 and 153 or to connect contacts 154 and The operation of the structure described above, will be explained. First, the function for preventing opening of the door 3 when the same has to be held closed, will be described. As regards the electromagnetic lock 17, an opening/closing signal can be applied thereto as desired, by using the touch panel 38.

A wafer procedure for wafers introduced into an exposure apparatus may include a step (1) for moving a wafer cassette upwardly and downwardly to detect the wafer position, and a step (2) for picking up a desired wafer by using a robot hand and for moving it to a prealignment position, and so on. Also, the procedure may include a step (3) of wafer exposure, a Step (4) for collecting the exposed wafer back into the wafer cassette, by using the robot hand, a step (5) for collecting all the wafers, and a step (5) where collection of the wafer cassettes is waited for. During steps (1) to (5) in this procedure, the pawl 52 of the electromagnet 17 is kept protruded, such that the window 3 can not be opened. The window 3 can not be opened unless the step (6) comes. This is controlled through the CPU 42.

Next, the function of the micro-switch 16 and the cheat switch 15 Will be explained. The state (signal) of the micro-switch 16 is processed by the signal processing board 41, and the result is applied to the computer 42. In the state shown in FIG. 12 wherein the door is closed, the contacts (small circles) of the micro-switch 16 are connected with each other, and the electric circuit is in a closed state. After checking the closed state of the micro-switch 16, the computer 42 operates to perform the sequential processes, including the steps (1)–(5) described above.

The cheat switch 15 is used when any works such as service should be performed while holding the window 3 opened. Although the sequence starts after checking the closed state of the micro-switch 16 as has been described with reference to the micro-switch 16, practically, this is associated also with the on/off state of the cheat switch 15. Unless the cheat switch 15 is closed, the sequence does not start.

In the state shown in FIG. 13 in which the door is opened, the cheat switch 15 as well as the micro-switch 16 are turned off. As the step (6) described above comes, the electromagnet lock 17 is disengaged and, when the window is opened, the state in question is established. Since in this state the switches 15 and 16 are held turned off, the sequence does not start. Naturally, the laser emission does not start.

If the apparatus is to be operated while the door is kept opened, as shown in FIG. 14, the interlock disabling switch 39 is turned on This switch is provided with a key-lock. Use of the key lock is because any operation to be performed While actuating the interlock disabling switch 39 is the work to be done by a superior service person, such that an inferior operator does not access that switch normally. With the operation described above, a state the same as resulting from turning the micro-switch 16 on results. Subsequently, the operation rod 150 of the cheat switch 15 is pulled, by which the contact element 151 is brought into engagement with the upper contacts 152 and 153. The resultant state is electrically equivalent to the state shown in FIG. 12. Therefore, the sequence can be continued while the door is kept opened.

The exposure apparatus does not start the sequence unless an operation starting switch (not shown) is pushed. This is because, in semiconductor safety guideline S2-93, an additional operation (pushing the switch, in this example) is required after actuation of the cheat switch.

In the circuit for the X-Y stage 36 portion shown in FIG. 15, as described above, the procedure in the CPU 42 and the signal processing board 41 differs from that for the door 3 of the conveyance system. The X-Y stage is not interlocked, whereas the laser device is interlocked. This is accomplished by providing no cheat switch for the X-Y stage and by providing the cheat switch 15 for the laser device.

[Seventh Embodiment]

Figure 16:
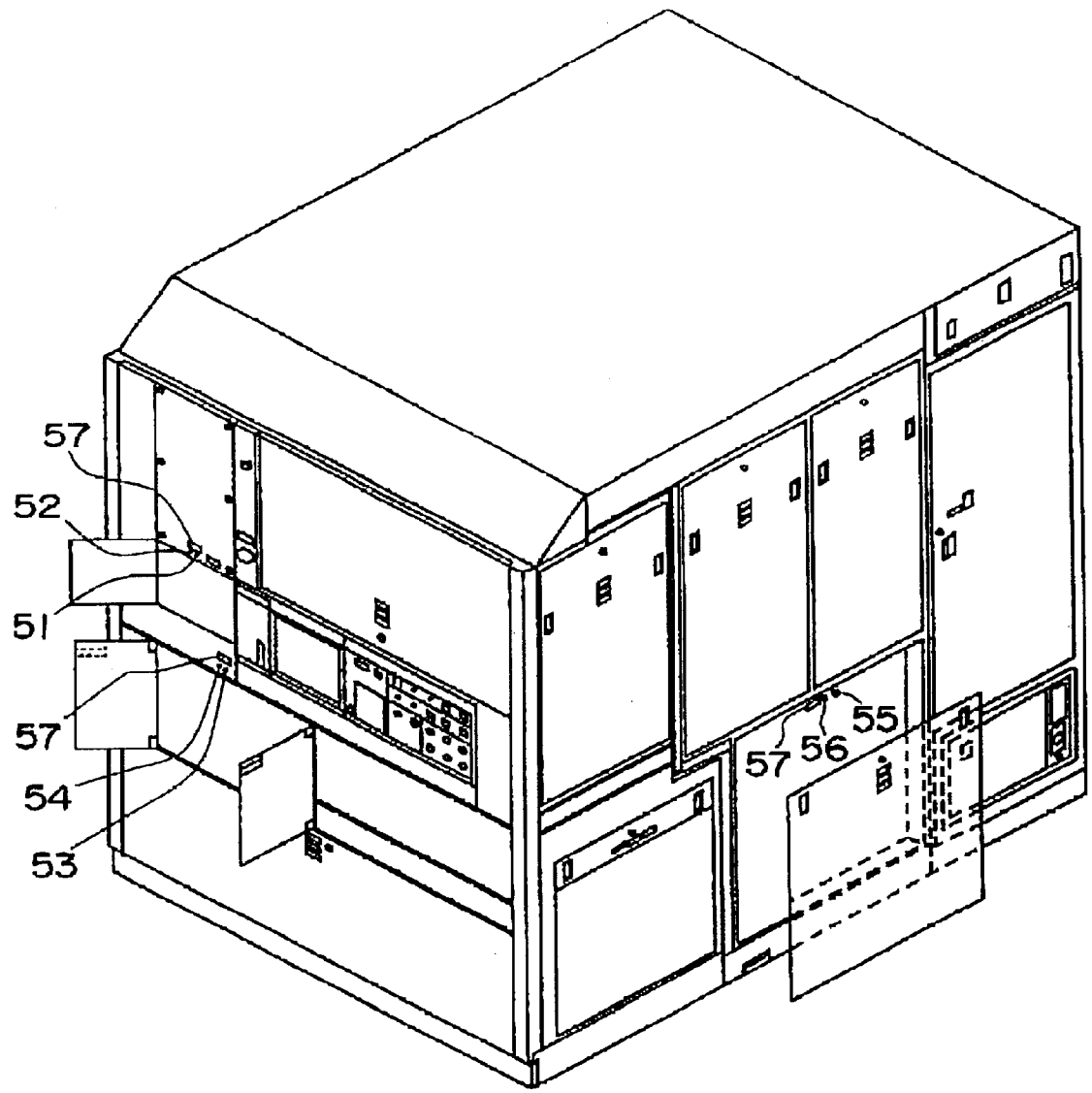
FIG. 16 is a perspective view of an outside appearance of a semiconductor exposure apparatus according to a seventh embodiment of the present invention.

FIGS. 16–21 Show a seventh embodiment. As shown in FIG. 16, this embodiment uses display lamps 51–56 in place of the electromagnetic look. Denoted at 51, 53 and 55 are lamps (or LEDs) of red color. Denoted at 52, 54 and 56 are green-color lamps (or LEDs). When opening the door is prohibited, the red-color LEDs may be lighted. If opening the door is allowed, the green-color LEDs may be lighted. Thus, in this embodiment, the door may be opened on the basis of color of the LEDs. Denoted at 57 is a label on which information such as "red light: door must not be opened; green light: door may be opened" is printed. Each of the doors may be provided with such a label 57.

Figure 18:
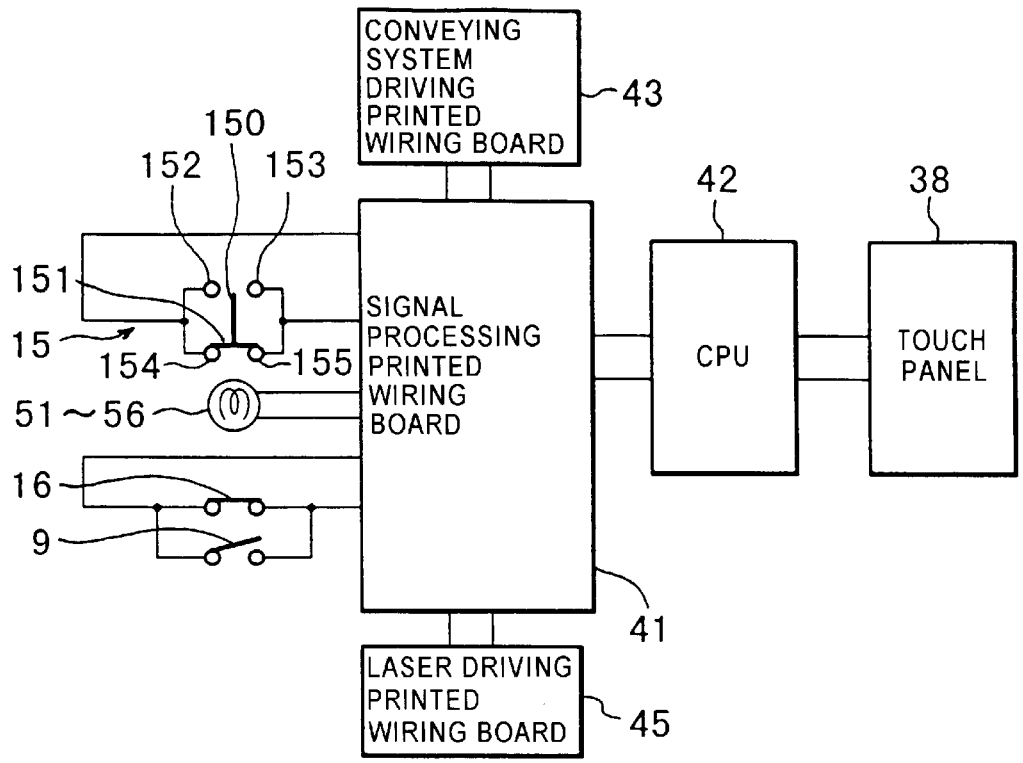
FIG. 18 is a circuit block diagram for explaining switches in a state in which the door of the apparatus of FIG. 16 is closed.
Figure 19:
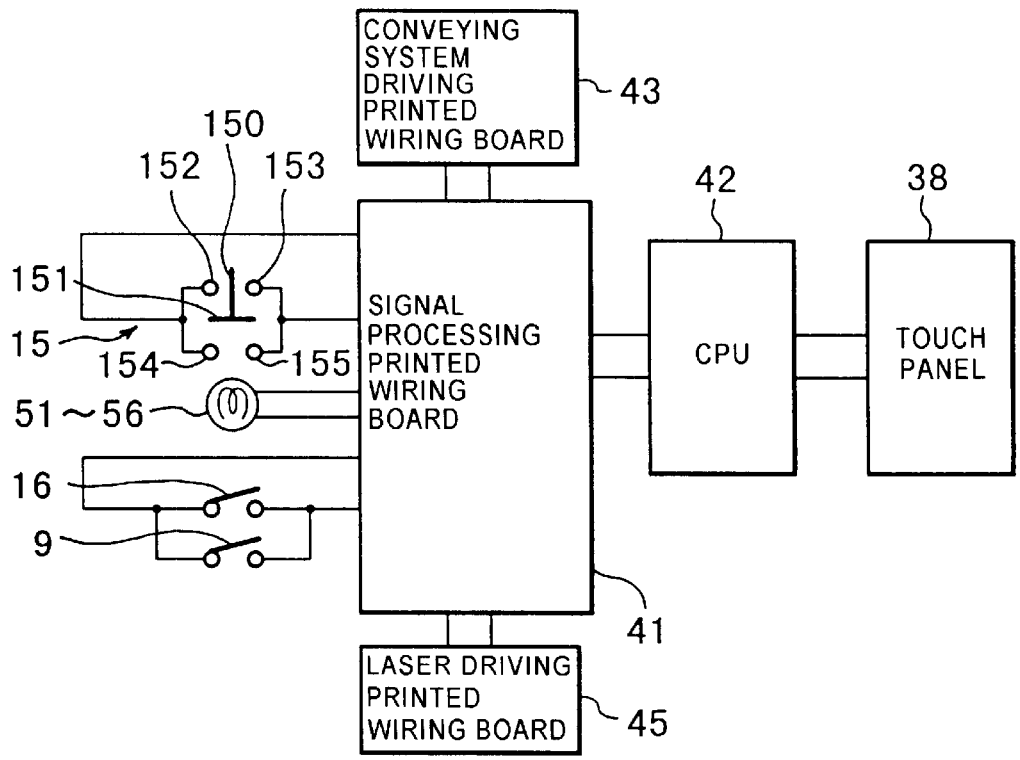
FIG. 19 is a circuit block diagram for explaining switches in a state in which the door of the apparatus of FIG. 16 is opened.
Figure 20:
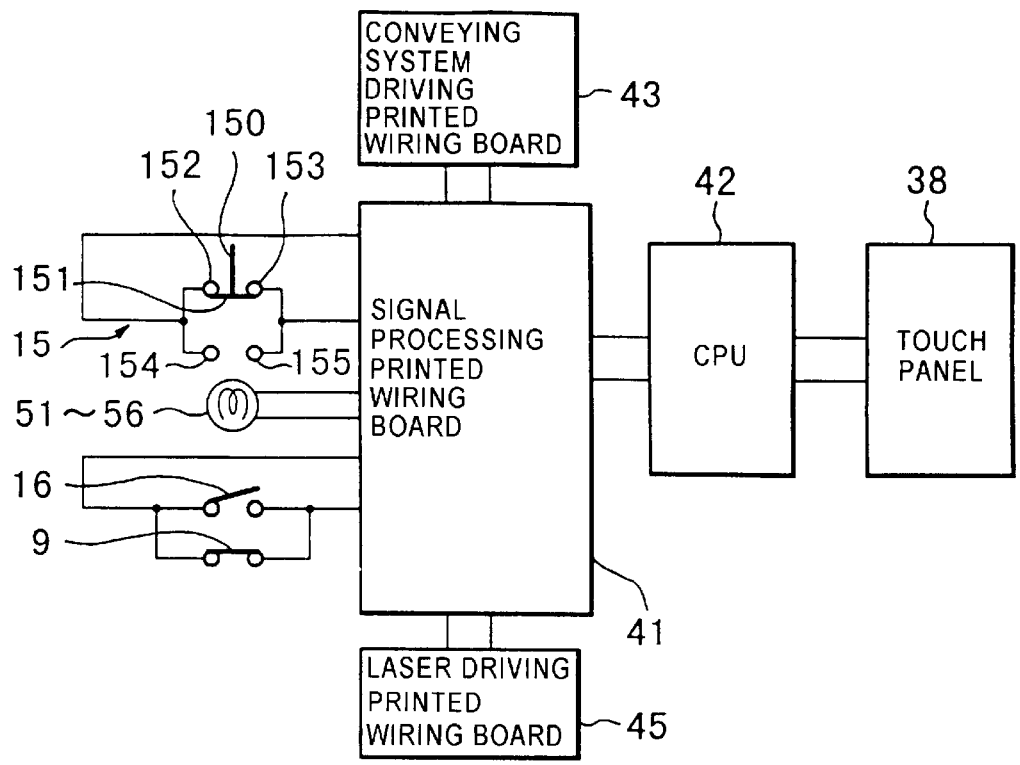
FIG. 20 is a circuit block diagram for explaining switches in a state in which the door of the apparatus of FIG. 16 is opened while the interlocking is disabled.
Figure 21:
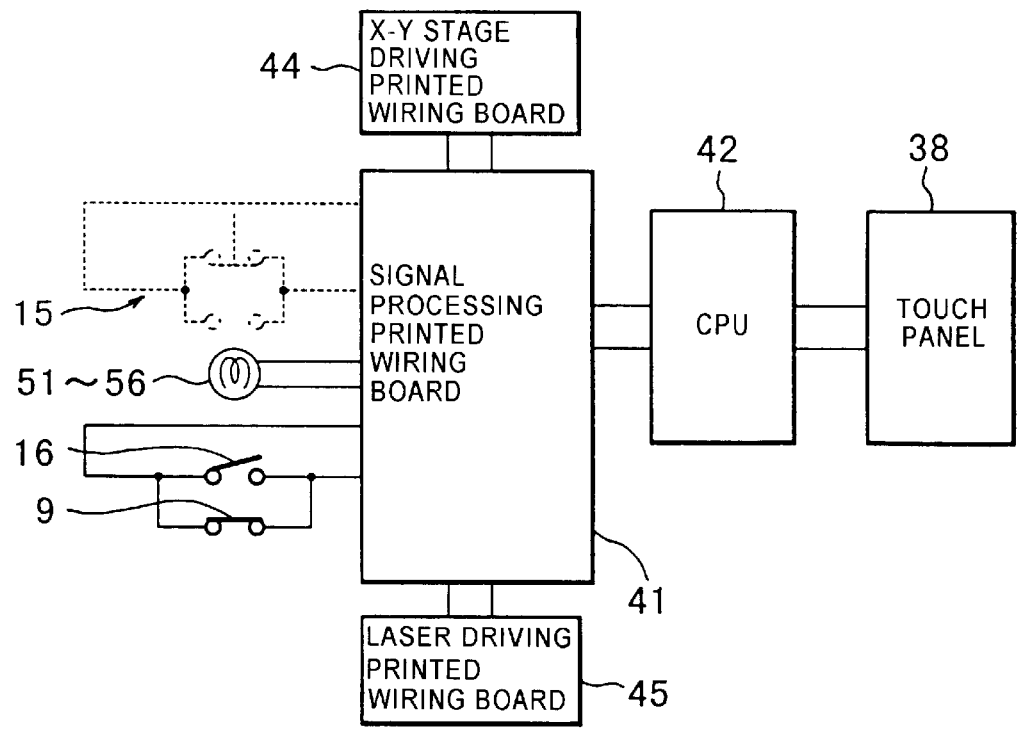
FIG. 21 is a circuit block diagram for explaining switches associated with another door in the apparatus of FIG. 16.

As shown in FIG. 17, in this embodiment, there is no electromagnetic lock such as used in the FIG. 11 embodiment. As shown in FIGS. 18–20, the lamps (LEDs) 51–56 may be disposed at the position of the electromagnetic lock, in place thereof. As regards the timing for lighting the LED, the red LED lighting timing corresponds to the timing for turning the electromagnetic lock on. The green LED lighting timing corresponds to the timing for turning the electromagnetic lock off. The remaining structure and function are similar to those of the fifth embodiment. FIG. 21 is a case using lamps (LEDs) 51–56 in place of the electromagnetic lock 17 of FIG. 15. The remaining structure is similar to that of FIG. 15.

[Embodiment of Device Manufacturing Method]

Next, an embodiment of a semiconductor device manufacturing method which uses a semiconductor exposure apparatus such as described above, will be explained.

Figure 22:
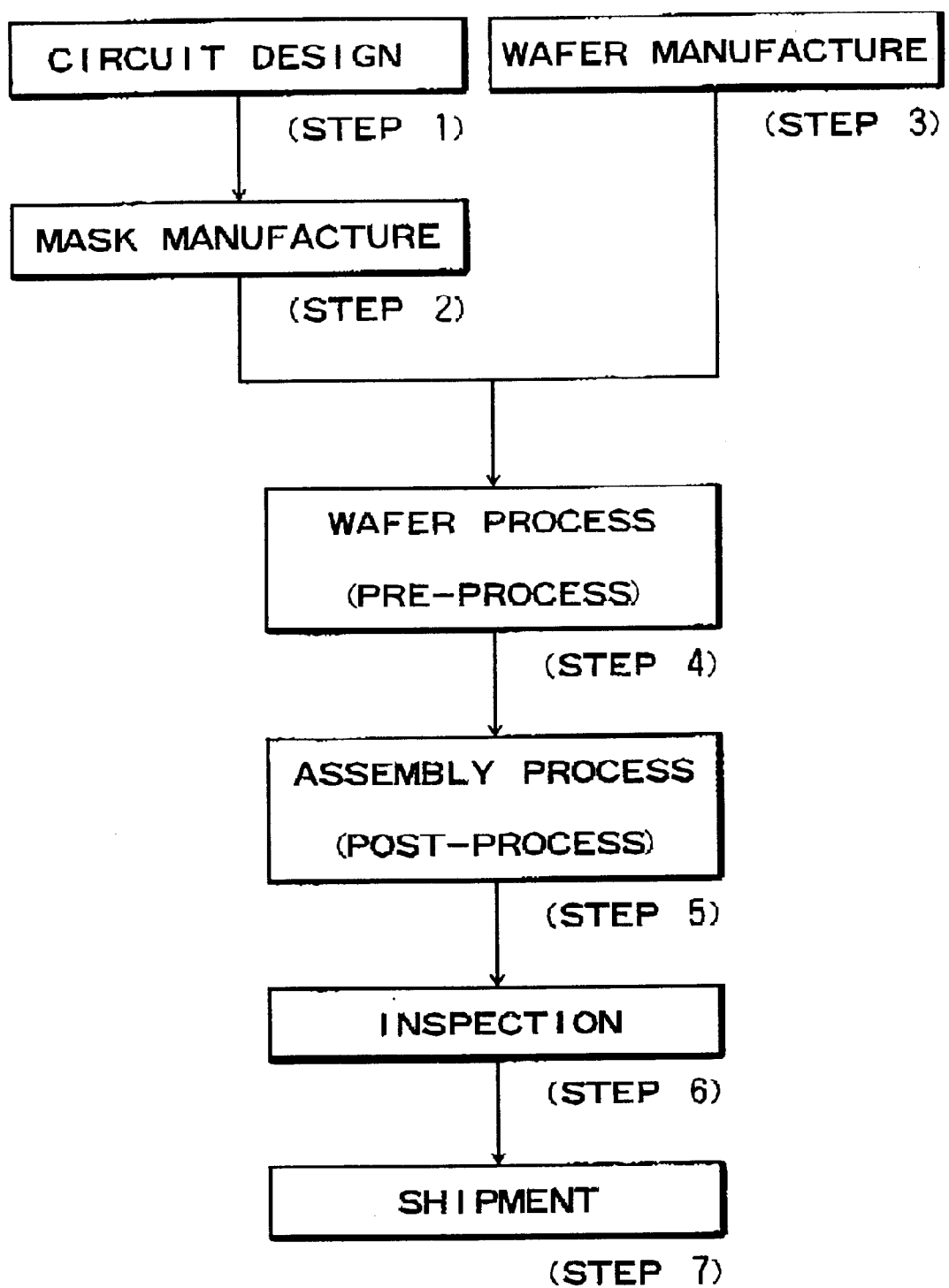
FIG. 22 is a flow chart of device manufacturing processes in which a semiconductor exposure apparatus according to the present invention can be used.

FIG. 22 is a flow chart of procedure for manufacture of microdevices such as semiconductor chips (e.g. ICs or LSIs), liquid crystal panels, CCDs, thin film magnetic heads or micro-machines, for example.

Step 1 is a design process for designing a circuit of a semiconductor device. Step 2 is a process for making a mask on the basis of the circuit pattern design. Step 3 is a process for preparing a wafer by using a material such as silicon. Step 4 is a wafer process (called a pre-process) wherein, by using the so prepared mask and water, circuits are practically formed on the wafer through lithography. Step 5 subsequent to this is an assembling step (called post-process) wherein the wafer having been processed by step 4 is formed into semiconductor chips. This step includes an assembling (dicing and bonding) process and a packaging (chip sealing) process. Step 6 is an inspection step wherein operation check, durability check and so on for the semiconductor devices provided by step 5, are carried out. With these processes, semiconductor devices are completed and they are shipped (step 7).

Figure 23:
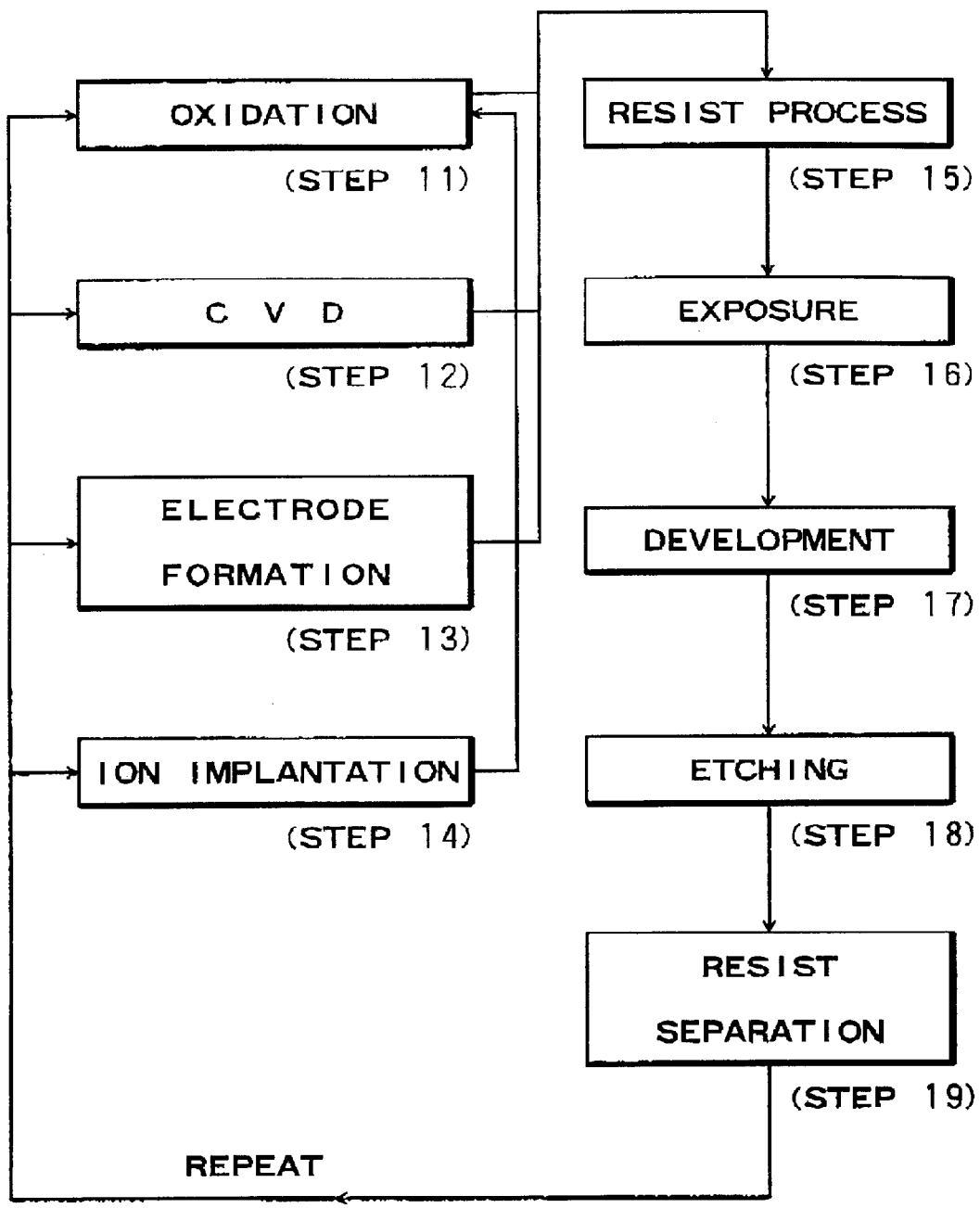
FIG. 23 is a flow chart for explaining details of a wafer process in the procedure of FIG. 22.

FIG. 23 is a flow chart showing details of the wafer process (step 4).

Step 11 is an oxidation process for oxidizing the surface of a wafer. Step 12 it a CVD process for forming an insulating film on the wafer surface step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured.

In accordance with the embodiments of the present invention described hereinbefore, there is an interlock disabling switch function provided. This enables easy disabling of interlocking, and facilitates the operation efficiency. Also, there may be a double disabling switch provided. This provides a safeguard to failure of not turning off the interlock disabling switch. Further, when the interlock disabling switch is held turned on, a corresponding warning may be displayed at a monitor. This is effective to avoid inadvertent mistake of not turning off the interlock disabling switch. The structure may be arranged so that, unless the interlock disabling switch is turned off, restart of the apparatus in response to closure of a door, for example, is physically prohibited. This effectively avoids any inconveniences which night occur as a result of inadvertent mistake of not turning the interlock disabling switch off.

The opening/closing mechanism may be provided with locking means which can be released only at a timing whereat opening the mechanism is allowed, or it may be provided with notifying means for notifying the timing for opening the mechanism. This prevents unnecessary application of interlocking. Further, in connection with an opening/closing mechanism without having an interlocking function, opening the same when to do so is not preferable can not be prevented. Since inappropriate application of interlocking is avoided, a decrease of the throughput can be reduced. Further, there may be a disabling switch provided, for disabling the interlocking function. With this structure, any works such as a service operation or a maintenance operation can be done while holding the opening/closing mechanism opened.

While the invention has been described with reference to the structures disclosed herein, it is not confined to the details set forth and this application is intended to cover such modification or changes as may come within the purposes of the improvements or the scope of the following claims.

What is claimed is:

1. A semiconductor manufacturing apparatus, comprising:
   guard means;
   interlocking means for stopping a predetermined operation of said apparatus in response to loss of a function of said guard means;
   an unconditional interlock disabling switch for disabling the interlocking through said interlocking means; and
   a double disabling switch for disabling the interlock disabling function of said unconditional interlock disabling switch.

2. An apparatus according to claim 1, wherein said double disabling switch responds automatically to recovery of the lost function of said guard means in response to a signal from a signal processing means, and wherein, in response thereto, said interlock disabling switch loses its switching function.

3. An apparatus according to claim 1, said guard means includes one of a door and a cover, and wherein said double disabling switch is provided adjacent to said door or said cover.

4. An apparatus according to claim 3, wherein the function of said guard means is lost as said door or said cover is opened, and wherein said double disabling switch is arranged so that said interlock disabling switch acquires a switching function in response to the opening or demounting of the door or the cover and that it loses the switching function in response to the closing or mounting of the door or the cover.

5. An apparatus according to claim 3, wherein the door or the cover is closed or mounted, for temperature control of said apparatus.

6. An apparatus according to claim 1, further comprising display means for indicating that said interlock disabling switch is turned on as the same is turned on.

7. An apparatus according to claim 1, further comprising prevention means for preventing resuming the operation of said apparatus as said interlock disabling switch is turned on.

8. An apparatus according to claim 3, wherein the door or the or the cover is closed or mounted, for temperature control of said apparatus.

9. An apparatus according to claim 1, wherein said apparatus comprises an exposure apparatus.

10. A semiconductor device manufacturing method, comprising the steps of:
    applying a photosensitive material onto a wafer;
    performing a process by use of a semiconductor manufacturing apparatus as recited in claim 1; and
    developing the wafer after being exposed.

11. A semiconductor manufacturing apparatus, comprising:
    guard means;
    a plurality of interlocking means for stopping a predetermined operation of said apparatus in response to loss of a predetermined function of said guard means;
    a plurality of interlock disabling switches provided in association with said plurality of interlocking means, for disabling functions of said plurality of interlocking means; and
    an unconditional interlock disabling switch for disabling at once, the interlocking through two or more interlocking means of said plurality of interlocking means.

12. An apparatus according to claim 11, further comprising a double disabling switch for disabling the interlock disabling function of said unconditional interlocking disabling switch.

13. An apparatus according to claim 12, wherein said double disabling switch responds automatically to recovery of the lost function of said guard means in response to a signal from a signal processing means, and wherein, in response thereto, said unconditional interlock disabling switch loses its switching function.

14. An apparatus according to claim 11, said guard means includes one of a door and a cover, and wherein said double disabling switch is provided adjacent to said door or said cover.

15. An apparatus according to claim 14, wherein the function in said guard means is lost as said door or said cover is opened, and wherein said double disabling switch is arranged so that said unconditional interlock disabling switch acquires a switching function in response to the opening or demounting of the door or the cover and that it loses the switching function in response to the closing or mounting of the door or the cover.

16. An apparatus according to claim 11, further comprising display means for indicating that said unconditional interlock disabling switch is turned on as the said unconditional interlock disabling switch is turned on.

17. An apparatus according to claim 11, further comprising prevention means for preventing resuming the operation of said apparatus as said unconditional interlock disabling switch is turned on.

18. An apparatus according to claim 11, wherein said apparatus comprises an exposure apparatus.

19. A semiconductor device manufacturing method, comprising the steps of:
    applying a photosensitive material onto a wafer;
    performing a process by use of a semiconductor manufacturing apparatus as recited in claim 11; and
    developing the wafer after being exposed.

20. A semiconductor manufacturing apparatus, comprising:
    an opening and closing mechanism including a door or a cover being made openable and closable or mountable and demountable;
    interlocking means operable in response to the opening of said opening and closing mechanism to stop a predetermined operation of said apparatus; and
    a plurality of interlock switches each being turned off in response to the opening of said opening and closing mechanism, and a disabling switch for disabling interlocking through at least one of said interlock switches, wherein said interlocking means is operable in response to the turning off of said interlock switches to stop said predetermined operation.

21. The apparatus according to claim 20, wherein said disabling switch has a key-lock mechanism.

22. An apparatus according to claim 20, wherein said apparatus comprises an exposure apparatus.

23. A semiconductor device manufacturing method, comprising the steps of:

applying a photosensitive material onto a wafer;

performing a process by use of a semiconductor manufacturing apparatus as recited in claim 20; and developing the wafer after being exposed.

24. The apparatus according to claim 20, wherein said apparatus has a discriminator or adaptation to discriminate, whether the opening of said door or covers is permissible, prior to the opening of said door or cover, on the basis of the state of said apparatus; and output means for producing an output corresponding to the result of discrimination.

25. The apparatus according to claim 24, wherein said output means includes means for notifying the result of discrimination.

* * * * *

UNITED STATES PATENT AND TRADEMARK OFFICE
CERTIFICATE OF CORRECTION

PATENT NO. : 6,456,364 B1
DATED : September 24, 2002
INVENTOR(S) : Shunzo Imai

It is certified that error appears in the above-identified patent and that said Letters Patent is hereby corrected as shown below:

Title page,
Item [56], References Cited, U.S. PATENT DOCUMENTS,
"5,272,585 A" should read -- 5,272,385 A --.

Column 2,
Line 12, "looses" should read -- loses --; and
Line 13, "cover" should read -- cover. --.

Column 3,
Line 6, "a inversive" should read -- an inversive --.

Column 4,
Line 43, "mounted;" should read -- mounted, --; and
Line 53, "of" should be deleted.

Column 5,
Line 9, "keylock." should read -- key-lock. --;
Line 13, "applicable" should read -- applicable. --; and
Line 37, "demounted." should read -- demounted. --

Column 6,
Line 12, "described" should read -- is described --; and
Line 29, "therefor" should be deleted.

Column 7,
Line 8, "shows" should read -- show --;
Line 60, "operate" should read -- operates --; and
Line 66, "show" should read -- shows --.

Column 8,
Line 9, "Screws." should read -- screws. --;
Line 11, "meal" should read -- metal --;
Line 18, "Switches" should read -- switches --;
Line 22, "Shown" should read -- shown --;
Line 29, "and" should read -- and 155. --;
Line 30, "above," should read -- above --;
Line 42, "Step (4)" should read -- step (4) --;
Line 44, "step (5)" should read -- step (6) --; and
Line 51, "Will" should read -- will --.

UNITED STATES PATENT AND TRADEMARK OFFICE
CERTIFICATE OF CORRECTION

PATENT NO.   : 6,456,364 B1
DATED        : September 24, 2002
INVENTOR(S)  : Shunzo Imai It is certified that error appears in the above-identified patent and that said Letters Patent is hereby corrected as shown below:

<u>Column 9,</u>
Line 12, "While" should read -- while --; and
Line 37, "look." should read -- lock. --.

<u>Column 10,</u>
Line 5, "water," should read -- wafer, --; and
Line 20, "surface step 13" should read -- surface. Step 13 --.

<u>Column 11,</u>
Line 25, "said" should read -- wherein said --.

<u>Column 12,</u>
Line 20, "said" should read -- wherein said --.

Signed and Sealed this

Eleventh Day of March, 2003

JAMES E. ROGAN
*Director of the United States Patent and Trademark Office*